(12) United States Patent
Marcussen

(10) Patent No.: US 7,667,452 B2
(45) Date of Patent: Feb. 23, 2010

(54) DETECTOR CIRCUIT FOR MEASURING CURRENT

(75) Inventor: Andreas Marcussen, Frederiksberg (DK)

(73) Assignee: Liaisons Electroniques-Mecaniques LEM S.A., Plan-les-Ouates (CH)

( * ) Notice: Subject to any disclaimer, the term of this patent is extended or adjusted under 35 U.S.C. 154(b) by 87 days.

(21) Appl. No.: 11/666,865

(22) PCT Filed: Nov. 4, 2005

(86) PCT No.: PCT/DK2005/000705

§ 371 (c)(1),
(2), (4) Date: May 3, 2007

(87) PCT Pub. No.: WO2006/048020

PCT Pub. Date: May 11, 2006

(65) Prior Publication Data

US 2008/0122430 A1    May 29, 2008

(30) Foreign Application Priority Data

Nov. 5, 2004    (DK) .............................. 2004 01704

(51) Int. Cl.
*G01R 15/18* (2006.01)
(52) U.S. Cl. .............................. 324/117 R; 324/117 H; 324/127
(58) Field of Classification Search ............ 324/117 R, 324/117 H, 126, 127; 363/26, 56; 232/246, 232/357, 358
See application file for complete search history.

(56) References Cited

U.S. PATENT DOCUMENTS 3,226,639 A * 12/1965 McAdam .................. 324/99 R (Continued)

FOREIGN PATENT DOCUMENTS

| EP | 0 261 707 A1 | 3/1988 |
| EP | 0 314 234 A1 | 5/1989 |
| WO | WO-2005/052605 | 9/2005 |

*Primary Examiner*—Ha T. Nguyen
*Assistant Examiner*—Arleen M Vazquez
(74) *Attorney, Agent, or Firm*—Birch, Stewart, Kolasch & Birch, LLP

(57) ABSTRACT

Detector circuit for measuring relatively strong currents including a main current transformer (1) and two substantially identical auxiliary current transformers (2, 3) where a main current ($I_1$) induces magnetomotive forces in said main current transformer (1), said magnetomotive forces being counteracted by magnetomotive forces induced by a compensating current ($i_1$) while at the same time the two auxiliary transformers (2, 3) are magnetised in antiphase by means of a square wave/modulation signal. Furthermore the detector circuit includes a synchronous rectifier for generating an adjusting signal for the compensating current ($i_1$). According to the invention a compensating current is used for measuring current in a common winding (L3) surrounding the main transformer as well as the auxiliary transformers while at the same time a possible error signal in the shape of a voltage difference between the auxiliary transformers is used to adjust the compensating current ($i_1$) by means of a negative feedback loop.

4 Claims, 3 Drawing Sheets

U.S. PATENT DOCUMENTS

| | | | | |
|---|---|---|---|---|
| 4,482,862 A | * | 11/1984 | Leehey | 324/117 R |
| 4,616,174 A | * | 10/1986 | Jorgensen | 324/117 R |
| 4,661,174 A | | 4/1987 | Miyoshi et al. | |
| 4,912,396 A | * | 3/1990 | Groenenboom | 324/117 R |
| 5,309,086 A | * | 5/1994 | Johansson et al. | 324/117 R |
| 7,372,354 B2 | * | 5/2008 | Petersen | 336/229 |
| 7,388,363 B2 | * | 6/2008 | Jorgensen | 324/117 R |
| 2004/0140879 A1 | | 7/2004 | Schafer | |

* cited by examiner

DETECTOR CIRCUIT FOR MEASURING CURRENT

TECHNICAL FIELD

The invention relates to a detector circuit for measuring current including a main current transformer and two substantially identical auxiliary current transformers, where a main current induces magnetomotive forces in said main current transformer, said magnetomotive forces being counteracted by magnetomotive forces induced by a compensating current while at the same time the two auxiliary current transformers are magnetised in antiphase by means of a modulation signal, where the circuit includes a synchronous rectifier for generating an adjusting signal for the compensating current.

BACKGROUND ART

Danish Patent No. 149238 discloses a zero-flux current transformer for measuring the current for an electromagnet in a particle accelerator. As very high current values are involved, viz. several hundred amperes, the main current is advantageously converted into a comparatively weaker measuring current which is easy to handle, and which is passed through a measuring resistor. As a result the voltage drop across the measuring resistor is a measurement representing the value of the main current.

The known zero-flux current transformers are formed by a second harmonic magnetic modulator combined with a magnetic integrator. In principle a magnetic integrator includes a ring core of a ferromagnetic material, said ring core being provided with a primary winding, a secondary winding and a sensing winding. The sensing winding communicates with the inlet terminals of an amplifier driving the secondary current through a measuring resistor. Therefore an alteration of the magnetic flux in the ring core induces a voltage in the sensing winding, and this voltage effects the amplifier in such a manner that said amplifier generates a compensating current which counteracts the alteration of the flux caused by the primary current. As a result the magnetomotive forces generated by the current through the primary winding are equalized by the magnetomotive forces generated by the current trough the secondary winding in such a manner that a specific relationship exists between the current value in the primary winding and the current value in the secondary winding.

However, the magnetic integrator cannot handle DC and very low frequencies, and accordingly a separate circuit is required for this function. Such a circuit is formed by a magnetic modulator including two identically wound ring cores and a driver circuit. The ring cores are driven in saturation, and at a balance equaling zero flux the current curves are symmetrical in relation to zero. As a result the contents of equal harmonics are zero. Therefore it is possible to use either a direct, symmetrical detection by means of a window comparator/Schmitt trigger or a second harmonic detector using synchronous rectification of the current signal presenting the double frequency of the modulation signal. In both cases an output signal is obtained which is zero at a balance between the primary and the secondary ampere winding number. An imbalance in the ampere winding number results in a voltage of an amplitude and a polarity which depend on the degree and polarity of said imbalance. One core suffices for carrying out the latter detector function, but two cores in antiphase are necessary in order to prevent the compensating circuit from suppressing the detection and in order to prevent the modulation signal from interfering with the magnetic integrator at magnetic coupling.

Furthermore Danish Patent Application No. PA 2003 01752 discloses a detector circuit of the above kind. However, the circuit described therein is relatively complicated.

DISCLOSURE OF INVENTION

Thus the object of the invention is to provide a circuit for measuring relatively strong currents which is simpler than previously known.

According to the invention a detector circuit of the above kind is characterised in that a compensating current is used for measuring current in a common winding surrounding the main transformer as well as the auxiliary transformers while at the same time a possible error signal between the auxiliary transformers is used for adjusting the compensating current, a negative feedback loop being provided, which automatically tries to establish an equilibrium.

Furthermore according to the invention the error signal may be a possible voltage difference between the transformers.

According to a particularly advantageous embodiment, the main current transformer is placed adjacent the auxiliary transformers, possibly so as to surround the auxiliary transformers.

BRIEF DESCRIPTION OF THE DRAWINGS

The invention is explained in detail below with reference to the drawings, in which.

BEST MODE(S) FOR CARRYING OUT THE INVENTION

Figure 1:
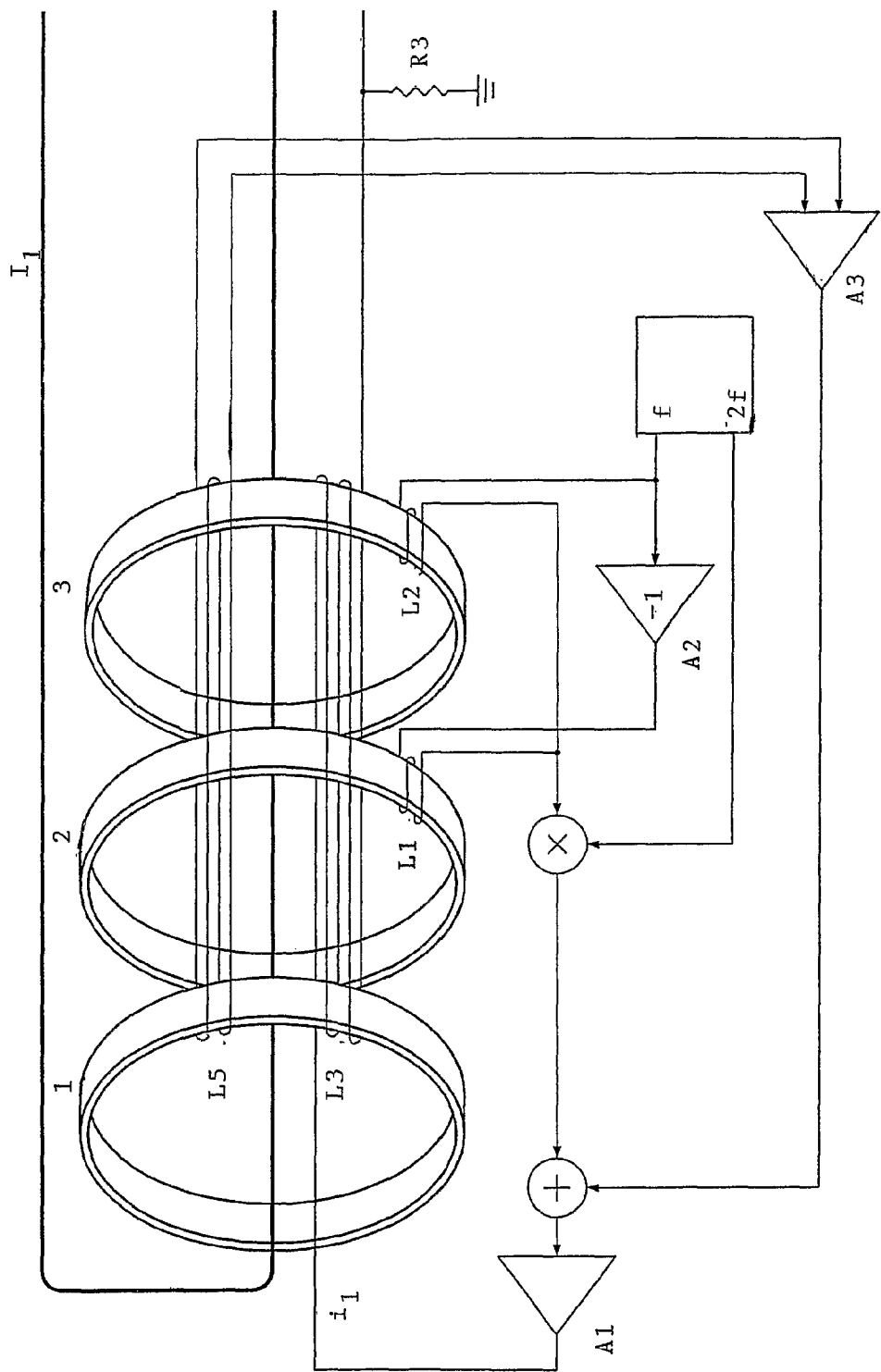
FIG. 1 illustrates a detector circuit according to the invention for measuring relatively strong currents.
Figure 2:
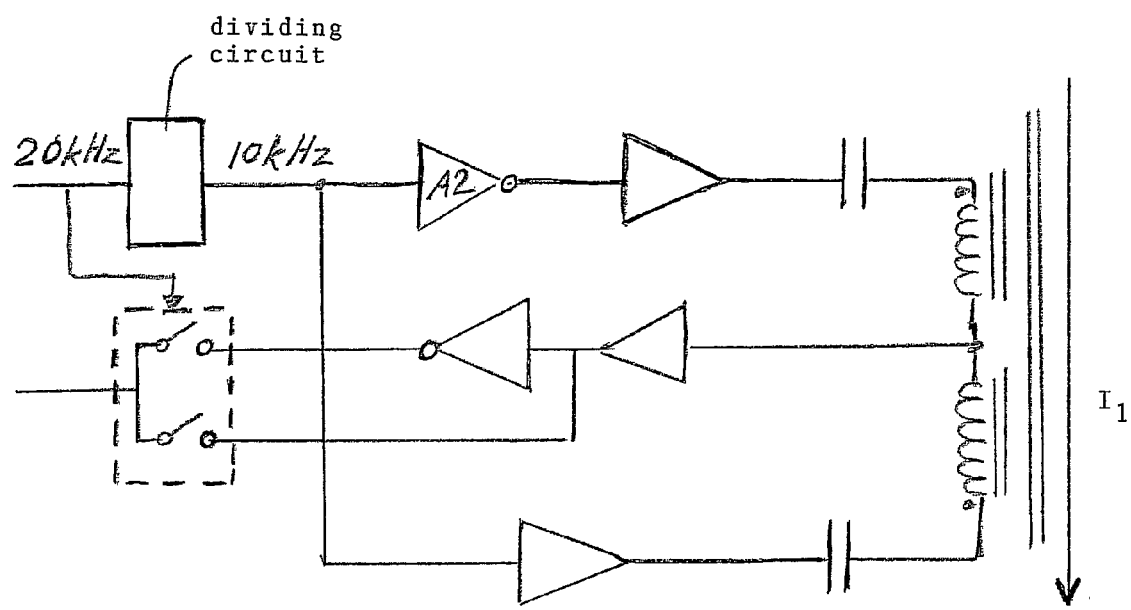
FIG. 2 illustrates a specific embodiment of the detector circuit without showing the compensating winding and the AC pickup winding.
Figure 3:
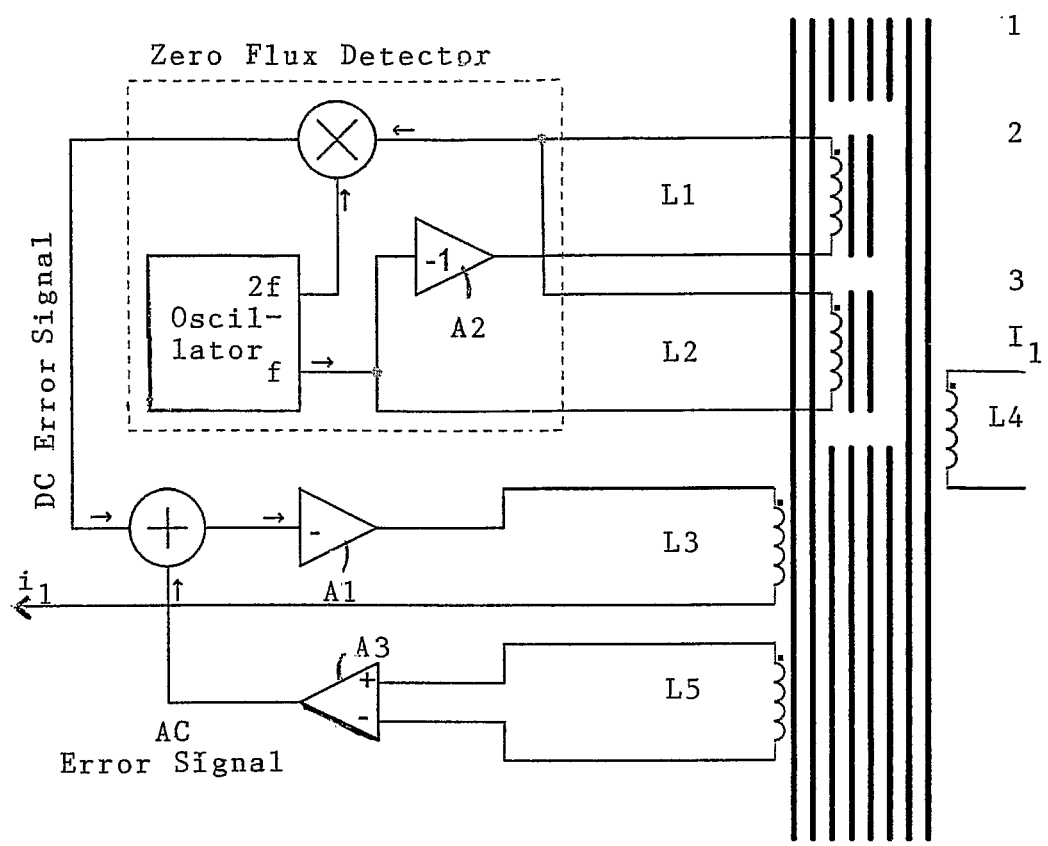
FIG. 3 illustrates the detector circuit with the compensating winding and the AC pickup winding.

The detector circuit shown in FIGS. 1 and 2 for measuring relatively strong currents includes a ring-shaped main transformer 1 which surrounds a conductor in which the main current flows, and two substantially identical ring-shaped auxiliary current transformers 2, 3 also surrounding the conductor in which the main current $I_1$ flows. The three ring-shaped transformer cores are wound with a compensating winding L3. Thereby a main current $I_1$ flowing through the three ring-shaped cores 1, 2, 3 causes a compensating current $i_1$ to flow in the compensating winding L3, said compensating current $i_1$ trying to counteract the magnetomotive forces induced by the main current $I_1$. At the same time the two auxiliary transformers 2, 3 are magnetized in antiphase by means of a modulation signal originating from a balanced drive, e.g. in form of a square wave signal of a frequency f of for instance 10 KHz which appears by stepping down of a signal with twice the frequency 2f. The modulation signal is led directly to a winding L2 by one of the auxiliary transformers 3 and inverted to the winding L1 of the auxiliary transformer 2, whereby the two transformers 2, 3 are modulated in antiphase. The cores 2, 3 are driven in saturation, and at balance the signal curves are symmetrical in relation to zero. As a result the contents of equal harmonics are zero. Therefore it is possible to use a direct, symmetrical detection by means of a second harmonic detector using synchronous rectification of the signal presenting the double frequency 2$f$ of the modulation signal f. In the case of an imbalance, an error signal is generated in the shape of a signal voltage whose amplitude and polarity depend on the size and polarity of the imbalance. By means of a feedback loop the latter signal voltage can be used to adjust the compensating current $1_1$. Furthermore the detector circuit is equipped with an AC pickup winding L5 wound around all three cores 1, 2, 3. It is wound around core 1 so that it is capable of detecting AC current with a frequency exceeding 1 Hz as well as of compensating for this by means of an additional circuit with a negative feedback. The fact that the winding L5 also surrounds cores 2 and 3 furthermore results in some compensating for possible differences between cores 1 and 2 by means of the negative feedback. Although, to some degree, possible differences between the cores 1 and 2 are compensated for, they should be as equal as possible because possible differences might result in noise in the measuring result as well as in the main current to be measured.

Physically, core 1 is placed close to cores 2 and 3 and it can optionally surround core 2 and core 3.

Furthermore the detector circuit includes one or more capacitors in order to compensate for possible DC imbalances.

The invention claimed is:

1. A detector circuit for measuring current including a main current transformer (1) and two substantially identical, serially coupled auxiliary current transformers (2, 3), where a main current ($I_1$) induces magnetomotive forces in said main current transformer (1), said magnetomotive forces being counteracted by magnetomotive forces induced by a compensating current ($i_1$) while at the same time the two serially coupled auxiliary current transformers (2, 3) are magnetised in antiphase by means of a modulation signal of a predetermined frequency, where the circuit includes a synchronous rectifier influenced by two times the modulation frequency for generating an adjusting signal to be added to the compensating current ($i_1$) to produce an adjusted compensating current, said adjusted compensating current being used for measuring the current in a first common winding (L3) surrounding the main transformer as well as the serially coupled auxiliary transformers (2, 3) while at the same time a possible error signal between the serially coupled auxiliary transformers (2, 3) is used for adjusting the compensating current ($i_1$), a negative feedback loop being provided, which automatically tries to establish an equilibrium, wherein the detector circuit further comprises a second common winding (L5) surrounding the main transformer as well as the serially coupled auxiliary transformers (2, 3) which detects the possible error signal as alternating voltage, wherein the second common winding compensates for said alternating voltage by means of the negative feedback loop.

2. The detector circuit according to claim 1, wherein the error signal is a possible voltage difference between the auxiliary transformers (2, 3).

3. The detector circuit according to claim 1, further comprising one or more capacitors in order to compensate for possible DC imbalances.

4. The detector circuit according to claim 1, wherein the modulation signal originates from a balanced drive.

* * * * *